United States Patent [19]
Chen

[11] Patent Number: 5,869,861
[45] Date of Patent: *Feb. 9, 1999

[54] COAXIAL CAPACITOR FOR DRAM MEMORY CELL

[75] Inventor: Chung-Zen Chen, Hsinchu, Taiwan

[73] Assignee: Vanguard International Semiconductor Corporation, Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 657,217

[22] Filed: Jun. 3, 1996

Related U.S. Application Data

[62] Division of Ser. No. 526,363, Sep. 11, 1995, Pat. No. 5,550,076.

[51] Int. Cl.[6] ........................ H01L 27/108; H01L 29/76
[52] U.S. Cl. ..................... 257/308; 257/296; 257/306; 257/309; 365/174; 438/396; 438/397
[58] Field of Search .................. 257/296, 305, 257/306, 307, 308, 303, 309; 437/52, 919; 365/149, 174; 438/396, 397

[56] References Cited

U.S. PATENT DOCUMENTS

| | | | |
|---|---|---|---|
| 5,084,405 | 1/1992 | Fazan et al. | 437/52 |
| 5,346,844 | 9/1994 | Cho et al. | 437/52 |
| 5,381,365 | 1/1995 | Ajika et al. | 365/149 |
| 5,396,456 | 3/1995 | Liu et al. | 365/174 |
| 5,444,653 | 8/1995 | Nagasawa et al. | 365/149 |
| 5,453,633 | 9/1995 | Yun | 257/306 |
| 5,491,103 | 2/1996 | Ahn et al. | 438/396 |
| 5,532,956 | 7/1996 | Watanabe | 365/149 |
| 5,574,299 | 11/1996 | Kim | 257/296 |
| 5,629,540 | 5/1997 | Roh et al. | 257/306 |

*Primary Examiner*—Valencia Martin-Wallace
*Attorney, Agent, or Firm*—George O. Saile; Stephen B. Ackerman; Graham J. Jones, II

[57] ABSTRACT

A DRAM capacitor is formed over a device with FOX regions and device areas with S/D regions. Form a planarization silicon oxide layer over the device and FOX areas covered with an etch stop layer and a first portion of a first capacitor plate over the planarization layer, a contact opening to the S/D areas by etching through the first capacitor layer and layers down to a S/D region. Form a second portion of a first plate over the device and through the contact opening into electrical and mechanical contact with one of the S/D areas, the second portion has exposed sidewalls and a top surface extending above the surface of the device. Form sacrificial spacers adjacent to the sidewalls of the second portion. Deposit a third portion of the first plate over the device. Etch back the third portion down to the etch stop layer to expose the sacrificial structure and remove the sacrificial structure. Form an interconductor dielectric layer and an upper capacitor plate extending between the second and third portions.

20 Claims, 8 Drawing Sheets

5,869,861

COAXIAL CAPACITOR FOR DRAM MEMORY CELL

This application is a division of U.S. application Ser. No. 08/526,363 filed Sep. 11, 1995, now U.S. Pat. No. 5,550,076.

BACKGROUND OF THE INVENTION

1. Field of the Invention

This invention relates to the process of manufacture of integrated circuit (IC) semiconductor devices and more particularly to manufacture of coaxial capacitor structures in dynamic random access memory (DRAM) devices and the like.

2. Description of Related Art

U.S. Pat. No. 5,084,405 of Fazan et al for "Process to Fabricate a Double Ring Stacked Cell Structure" shows a double ring structure, so there are four sidewalls on the top of the bottom polysilicon layer. The process of that patent provides node contact etching after silicon layer 41 and silicon nitride layer 42, as shown in FIG. 5.

See U.S. Pat. No. 5,346,844 of Cho et al for "Method for Fabricating Semiconductor Memory Device."

SUMMARY OF THE INVENTION

In accordance with this invention, there are only three sidewalls on the top of the bottom layer of polysilicon, since the inner ring of the prior art has been transformed into a solid "bar-like" structure.

Preferably, the etch stop layer has a thickness of about 500 Å; and/or the first portion has a thickness between about 500 Å and about 1,000 Å.

In accordance with still another aspect of this invention, a dynamic random access memory device has a capacitor formed thereon. There are field oxide areas on the surface of a semiconductor substrate with device areas for field effect devices has gate structures and source/drain structures, with a gate dielectric layer on the substrate in the device areas. There is a first layer of polysilicon on the the field oxide areas and the device areas patterned into the gate structure in the device areas, and portions over the field oxide areas. The source/drain structures are formed within the device areas of the semiconductor substrate associated with the gate structures. A first oxide layer is formed over the device and field oxide areas. A planarization silicon oxide layer is formed over the device and field oxide areas. The capacitor is formed with a contact opening to a source/drain structure etched through the device. A first portion of a first capacitor plate polysilicon layer is formed over the planarization layer. A second portion of a first capacitor plate comprises a polysilicon layer over the device which extends down through the contact opening into electrical and mechanical contact with one of the source/drain structures and doping the second portion. The second portion has exposed sidewalls and a top surface extending above the surface of the device. A third portion of the first capacitor plate polysilicon layer is formed over the device the first portion and the second portion into electrical and mechanical contact therewith, and providing doping thereof spaced away from the sidewalls providing a space therebetween from the top of the device. A blanket interconductor dielectric layer is formed over the exposed surfaces of the lower plate the device providing an exposed surface of the interconductor dielectric layer. An upper capacitor plate is located over the interconductor dielectric layer extending between the second and third portions. An etch stop layer is sandwiched between the planarization layer and the first portion.

Preferably, the etch stop layer has a thickness of about 500 Å.

Preferably, the interconductor dielectric layer and the upper plate reach between the first portion and the planarization layer.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
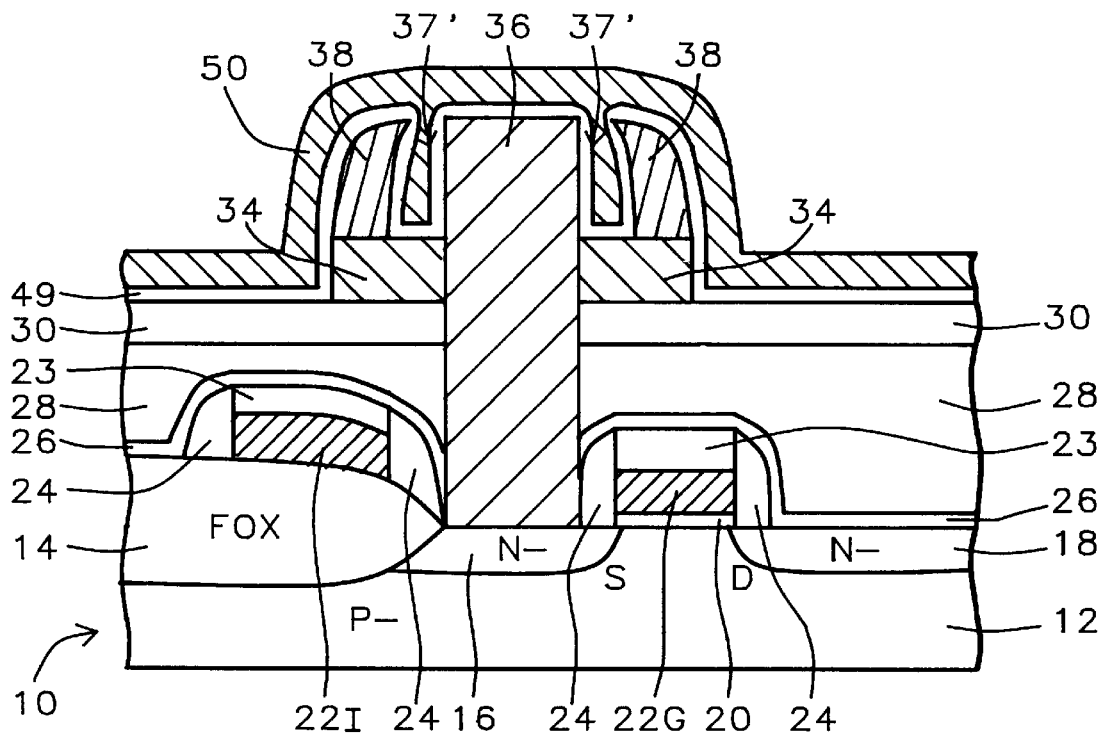
FIG. 1 shows a device which both incorporates the features of this invention and which has been manufactured in accordance with the method of this invention.

FIG. 1 shows an embodiment of a device which both incorporates the features of this invention and which has been manufactured in accordance with the method of this invention. The method of manufacture of the device of FIG. 1 is described below with reference to FIGS. 2A–2H. FIG. 3 and FIG. 4E show modifications of the preferred embodiment of the invention shown in FIG. 1.

The DRAM device 10 is shown with a field oxide (FOX) region 14 and a silicon dioxide gate oxide layer 20 formed on the surface of P-type silicon substrate 12. A first polysilicon layer has been formed over both the gate oxide layer 20 and FOX region 14 and patterned into a gate electrode 22G over layer 20 and interconnector 22I on region 14.

The semiconductor substrate 12 is preferably composed of silicon having a (100) crystallographic orientation. The silicon 12 remains as a mesa surrounded by the sunken silicon dioxide or field oxide (FOX) pattern 14.

Figure 2A:
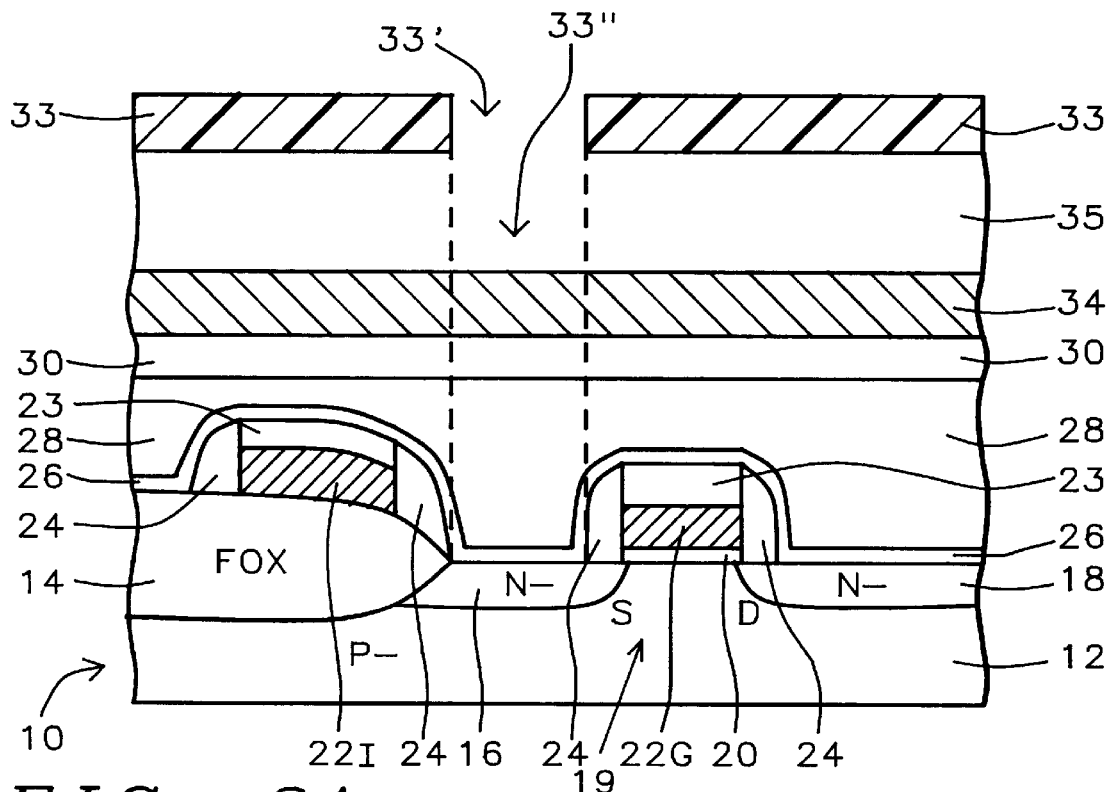
FIGS. 2A–2H illustrate a method of manufacture of the device of FIG. 1 in accordance with this invention.
Figure 3:
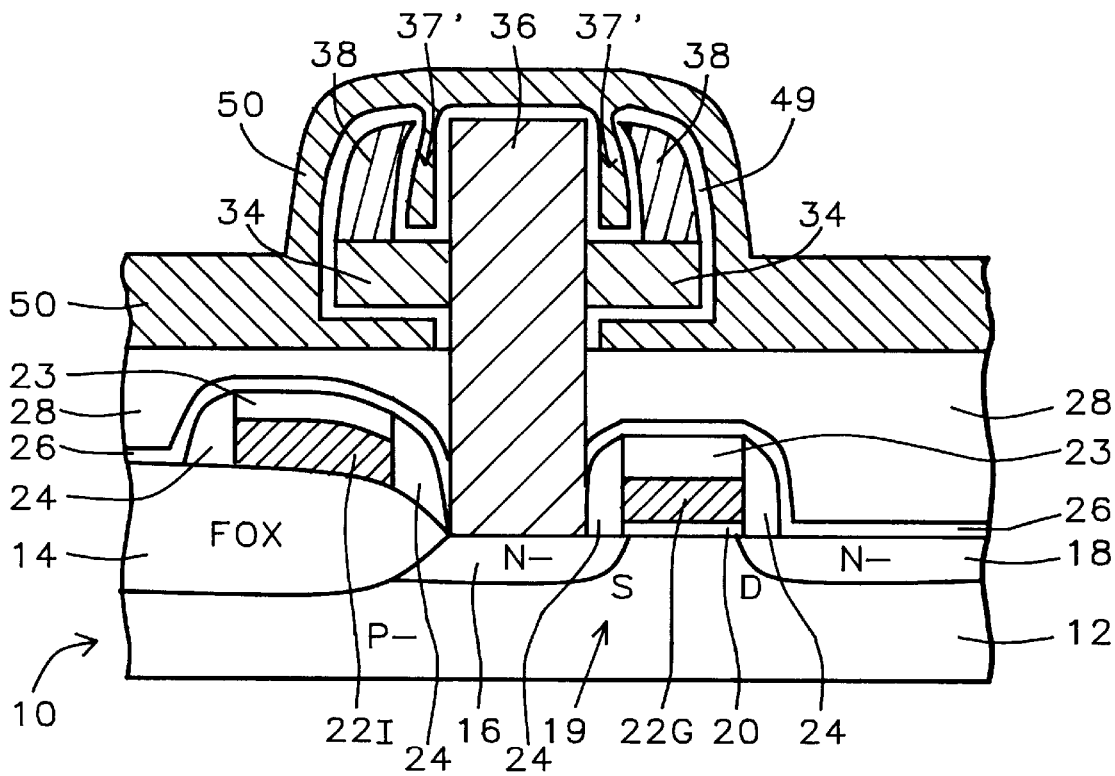
FIG. 3 shows a modification of the preferred embodiment of the invention shown in FIG. 1.

The gate electrode 22G is provided for a transistor 19 seen in FIG. 2A and a conductor (or interconnector) structure 22I is provided on the surfaces of FOX 14 or elsewhere as seen in FIG. 2A to provide interconnections to other circuits.

A P channel FET integrated circuit device could also be formed by simply substituting opposite doping types in place of those employed in the N channel embodiment shown in FIGS. 2A to 2H. Also, a CMOS FET could be formed, in a similar way, by making both N channel and P channel devices upon the same substrate.

Then N– dopant ions are ion implanted to form N-lightly doped source/drain regions 16 and 18 in the portions of substrate 12 beneath the portion of the surface of substrate 12 which are not covered by control electrode 22G which acts as a self-aligned mask and the FOX regions 14 which also mask the portions of substrate 12 therebelow.

A silicon dioxide structure 23 was formed on the first polysilicon layer interconnector 22I and gate electrode 22G.

Dielectric spacers 24 were formed adjacent to gate electrode 22G and interconnector 22I.

A BPSG layer 28, which has been planarized by a conventional heating process, covers the device prior to formation of plug 36.

A thin film silicon nitride $Si_3N_4$ layer 30 covers the BPSG layer 28.

A bottom doped polysilicon (poly 2-1) layer 34 was formed having a thickness of about 500 Å. Layer 34, which covers a portion of silicon nitride layer 30 is planar and is horizontally oriented.

The next layer is a silicon dioxide layer 35 formed by a conventional TEOS process described above, and having a thickness between about 5,000 Å and 10,000 Å thick, and preferably about 5,000 Å thick.

A node contact opening has been opened through the layers 30, 28, etc. down to the N– region 16.

Deposition of Node Contact Layer

A blanket polysilicon layer 36 (P2-2) was deposited over the device 10 reaching down into the opening etched previously. Polysilicon layer 36 (P2-2) is preferably between about 1,000 Å and about 3,000 Å thick. The blanket polysilicon layer 36 (P2-2) was doped and etched to form a polysilicon plug 36 extending above the layers 28 and 29. Plug 36 forms a vertically oriented column extending from the contact with region 16 well through the lower surface of planar bottom layer 34 and extending well above the upper surface of bottom layer 34.

TEOS glass spacer spacers 37 have been formed adjacent to the sidewalls of the plug 36.

A blanket polysilicon layer 38 (P2-3) has been deposited over the device 10 in electrical and mechanical contact with the plug 36 (P2-2) and with the exposed surface of bottom polysilicon (P2-1) layer 34.

Polysilicon layer 38 (P2-3) preferably has a thickness between about 500 Å and about 2,000 Å. The blanket polysilicon layer 38 (P2-3) has been doped.

The polysilicon layer 38 (P2-3) has been etched back with the silicon nitride layer 30 serving as an etch stop layer. The result is a pair of upright polysilicon elements 38 adjacent to the spacers 37 with a similar cross sectional shape to the spacers 37.

The device 10 is shown after sacrificial spacers have been etched away to form openings 37' between the upright polysilicon elements 38 and the polysilicon plug 36.

If at this point the silicon nitride layer has been wet etched away, the bottom plate of the crown can be enlarged to further increase the capacitor area.

The key feature here is that the central plug or bar 36 is superior when we shrink the cap size rather than employing another narrow ring as has been done in the prior art.

A conventional thin Nitride Oxide (NO) layer 49 of interconductor dielectric is formed next to permit formation electrical insulation from the upper capacitor plate 50. Conformal layer 49 leaves narrow spaces (openings) 37' between polysilicon plug 36 and upright polysilicon elements 38. Spaces (opening) 37' are narrowed by the thickness of layer 49. Layer 49 has a thickness of about 20–50 Å.

An in-situ polysilicon layer 50 forming the top plate of the DRAM capacitor has been deposited on the top of the surface of NO layer 49 to serve as a top plate electrode of the capacitor. Layer 50 is between about 500 Å and about 1,500 Å thick. Layer 50 fills the narrow spaces (opening) 37' between plug 36 and upright polysilicon elements 38 with the conformal layer 49 separating layer 50 form plug 36 and elements 38. Layer 50 includes narrow slivers in the openings 37' on either side of monolithic polysilicon plug 36 between the upright elements 38 extending down almost into contact with the bottom layer 34.

Process of Manufacture of Preferred Embodiment

FIG. 2A illustrates the results of the initial stages of manufacture of a DRAM structure upon which the new capacitor structure of this invention will be fabricated. A DRAM device 10 in an early stages of manufacture is shown with a field oxide (FOX) region 14 and a silicon dioxide gate oxide layer 20 formed on the surface of P-type silicon substrate 12 by a conventional process. A first blanket polysilicon layer has been formed over the gate oxide layer 20 and FOX region 14. (Later in the process, the blanket polysilicon layer is patterned to form a gate electrode 22G over gate electrode 20 and an interconnector 22I over FOX region 14, as explained below.)

The semiconductor substrate 12 is preferably composed of silicon having a (100) crystallographic orientation. In an effort to simplify the description and the drawings the dielectric isolation between devices has been only partially shown and will not be described in detail, as it is conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or field oxide (FOX) pattern 14.

Then semiconductor devices can be provided in the silicon mesas according to the following processes.

The surface of the silicon substrate 12 is thermally oxidized to form the desired thickness of gate oxide layer 20 having a preferred thickness between about 80 Å to 200 Å. Next, the first polysilicon layer (later to be formed into gate electrode 22G and conductor 22I) is blanket deposited by LPCVD (Low Pressure Chemical Vapor Deposition) method. The preferred thickness of the first polysilicon layer is between about 2,000 Å and about 4,000 Å. The first polysilicon layer can be doped by several methods. One method includes ion implanting with phosphorous or arsenic ions with a dose of between 5 E 15 ions/$cm^2$ and 10 E 15 ions/$cm^2$ at an energy of between 20 keV and 60 keV. Alternatively the polysilicon layer is doped with phosphorus oxychloride at a temperature of about 900° C.

The device 10 is shown after a blanket first polysilicon layer has been deposited upon device 10. Then a blanket silicon dioxide ($SiO_2$) layer was formed immediately after the blanket first polysilicon layer. Next a mask was formed to define a pattern and etch back the blanket silicon dioxide and first polysilicon layer forming polysilicon interconnector 22I over the FOX region 14 and polysilicon gate electrode 22G over the gate oxide 20. Layers 23 are formed over the interconnector 22I and the gate electrode 22G.

Preferred conditions for forming the dielectric structures 23 are LPCVD deposition of TEOS or silane based CVD silicon oxide deposition at about 600° C. to 900° C. The preferred thickness of dielectric layer 20 is between about 500 to 2500 Å and a preferred thickness of about 1500 Å.

The etching of the first polysilicon layer has been accomplished in accordance with the well known state of the art. The portions of first polysilicon layer unprotected by photoresist mask segments have been removed by anisotropic etching techniques, as is conventional in the art to provide a desired pattern. The etching leaves the gate electrode 22G for a transistor 19 seen in FIG. 2A and the conductor (or interconnector) structure 22I on the FOX 14 surfaces or elsewhere as seen in FIG. 2A.

The source/drain structure of the MOSFET 19 is then formed by steps which lead to the formation of an N channel FET integrated circuit device. However, it is well understood by those skilled in the art that a P channel FET integrated circuit device could also be formed by simply substituting opposite doping types in place of those employed in the N channel embodiment shown in FIGS. 2A to 2H. Also, a CMOS FET could be formed, in a similar way, by making both N channel and P channel devices upon the same substrate.

N– dopant ions have been ion implanted to form N– lightly doped source/drain regions 16 and 18 in the portions of substrate 12 beneath the portion of the surface of substrate 12 which are not covered by control electrode 22G which acts as a self-aligned mask and the FOX regions 14 which also mask the portions of substrate 12 therebelow. Lithographic masks (not shown) may be required to protect the areas not to be subjected to that particular N– ion implantation. The formation of the lithographic masks is done by conventional lithography and etching techniques. The N– lightly doped drain implantation is done with, for example, phosphorous $p^{31}$ at a dose of between 1 E 13 atoms/cm$^2$ and 10 E 13 atoms/cm$^2$ and with an energy of between about 30 keV and about 80 keV.

Next, a blanket silicon dioxide spacer layer has been formed on the device 10 in the conventional manner. A low temperature silicon oxide deposition is preferred, such as through the chemical vapor deposition of tetraethoxysilane (TEOS) at a temperature in the range of between about 650° C. and about 900° C. Other silicon oxide deposition methods include silane based LPCVD. The thickness of the dielectric silicon dioxide spacer layer is between about 1,000 Å and 2,000 Å, and preferably about 1,500 Å.

Then dielectric spacers are formed from the blanket silicon dioxide spacer layer by a process of anisotropic etching of the spacer layer producing a set of dielectric spacers 24 on the sidewalls of the gate electrode 22G and conductor structure 22I. The preferred process of anisotropic etching employs a conventional reactive ion etching ambient as will be well understood by those skilled in the art.

Then a blanket silicon dioxide layer 26 is formed by TEOS (Cl-TEOS.) A low temperature silicon oxide deposition is preferred, such as through the chemical vapor deposition of tetraethoxysilane (TEOS) at a temperature in the range of between about 650° C. and about 900° C. The thickness of the dielectric silicon dioxide spacer layer is between about 1,000 Å and 2,000 Å thick, and preferably about 1,500 Å thick.

Next, follow the steps of blanket deposition of a conventional BPSG layer 28, heating the device 10 to cause BPSG layer 28 to flow in the conventional process. The BPSG layer 28 is deposited between about 5,000 Å and 10,000 Å thick, and preferably about 5,000 Å thick. Then the BPSG layer 28 is etched back to between about 3,000 Å and 5,000 Å thick, and preferably about 4,000 Å thick to reduce topography, i.e. planarize the surface of the BPSG layer 28 so that it has a high degree of flatness.

Subsequently, the device is coated with a thin film silicon nitride $Si_3N_4$ layer 30 having a thickness of about 200 Å. The $Si_3N_4$ layer 30 is formed by the LPCVD method. The purpose of having $Si_3N_4$ layer 30 is to provide an interface between the BPSG layer 28 and polysilicon layer 34 which is required because it is used as an etch stop layer in the following $SiO_2$ etch step to protect the underlying oxide.

Next, the bottom polysilicon (poly 2-1) layer 34 is formed having a thickness of and about 1,000 Å about 500 Å.

The next layer is a silicon dioxide layer 35 formed by a conventional TEOS process described above, and having a thickness between about 2,000 Å and 10,000 Å thick, and preferably about 5,000 Å thick.

Finally a node contact photoresist mask 33 with an opening 33' centered over the source/drain region 16 of transistor 19 is applied over the device 10 to prepare for etching a node contact through layers 35, 34, 30, 28, and 26 down to the surface of source/drain region 16 of transistor 19.

FIG. 2A shows the device 10 with the node contact opening 33" described above shown in phantom where it is to be etched by a process of etching. The process used is selected from the group consisting of RIE, CVD, APCVD, and LPCVD, using a gas selected from the group consisting of $CF_4$ and $Cl_2$ gases in a low pressure chamber.

A series of more than one etching process is required to go through these layers, with one step for the silicon dioxide, one step for the polysilicon, and one for the silicon nitride.

Then the mask 33 is removed leaving the TEOS glass layer 35 with the opening 33" extending therethrough down to N– region 16.

Deposition of Node Contact Layer

A blanket polysilicon layer 36 (P2-2) is deposited over the device 10 reaching down into the opening 33" etched previously. Polysilicon layer 36 (P2-2) is preferably blanket deposited by an LPCVD (Low Pressure Chemical Vapor Deposition) method. The preferred thickness of the blanket polysilicon layer 36 is between about 1,000 Å and about 3,000 Å thick.

The blanket polysilicon layer 36 (P2-2) can be doped by several methods. One method includes ion implanting with phosphorous or arsenic ions with a dose of between 5 E 15 ions/cm$^2$ and 10 E 15 ions/cm$^2$ at an energy of between 20 keV and 60 keV. Alternatively the polysilicon layer is doped with phosphorus oxychloride at a temperature of about 900° C. The deep portion of polysilicon (p2-2) layer 36 doped at the bottom of hole 33" by diffusion of the dopant.

Figure 2B:
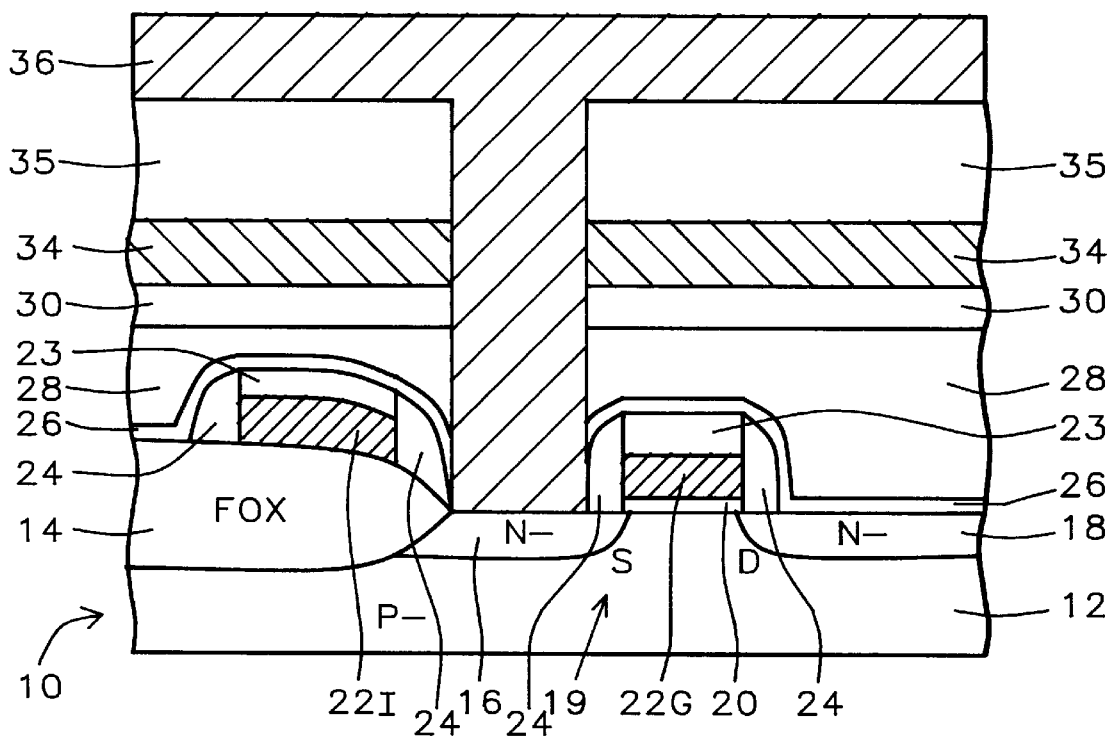
Figure 2C:
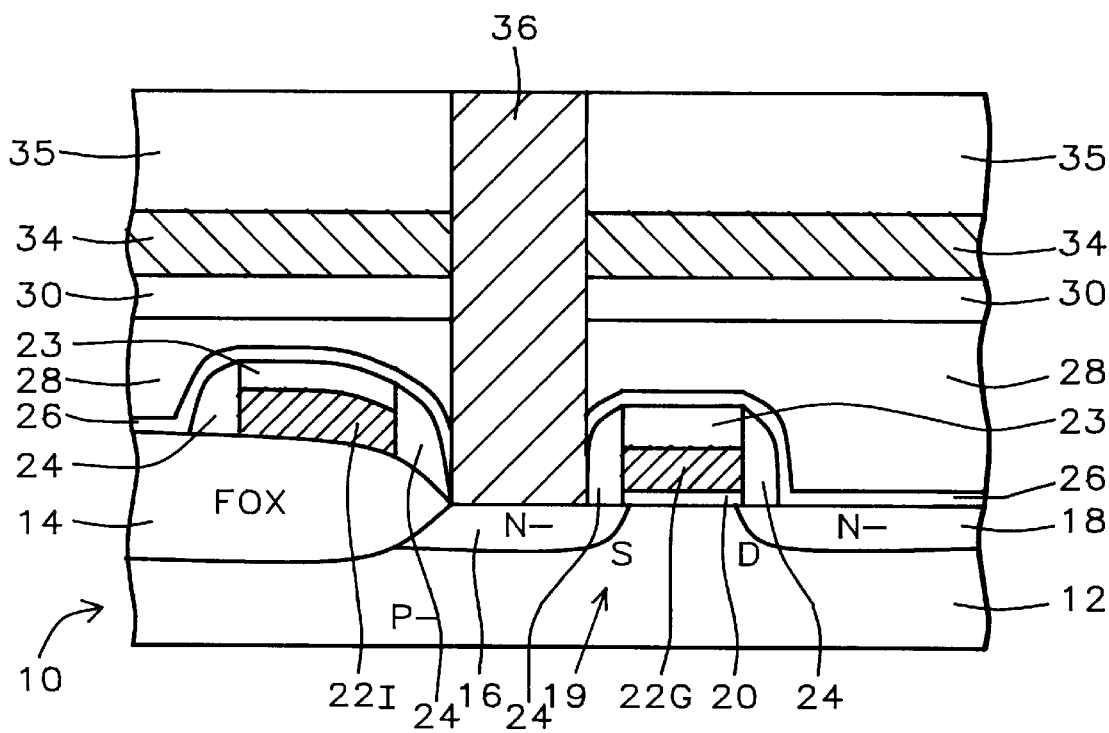

FIG. 2C shows the device of FIG. 2B after the polysilicon layer 36 (P2-2) has been etched back to form a polysilicon plug within the layer 35.

Figure 2D:
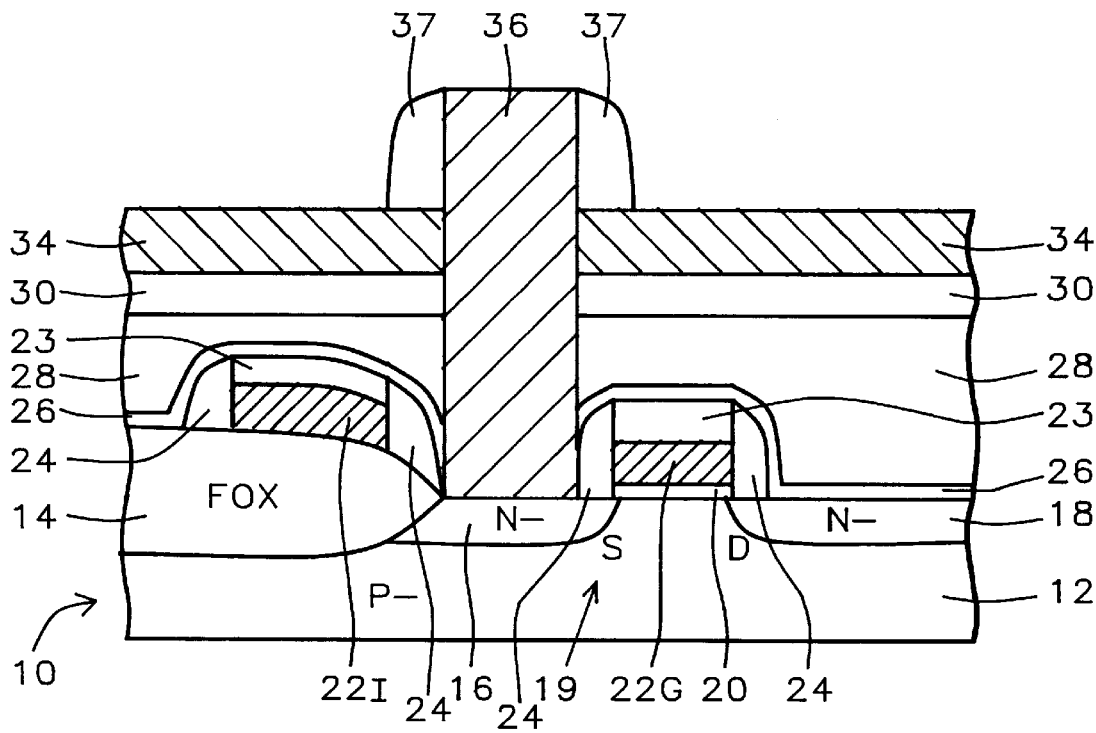

FIG. 2D shows the device of FIG. 2C after the TEOS glass layer 35 has been wet etched to remove the layer 35 completely. The wet etchant is used is conventional buffered hydrogen fluoride (HF.)

After etching is complete, the etchant is flushed or removed from the surface with deionized water cleaning.

Then a blanket spacer layer (not shown) of TEOS glass is formed one of the processes described above with a thickness between about 500 Å and 2,500 Å thick, and preferably about 1,000 Å thick.

Next, the blanket TEOS glass spacer layer is etched to form spacers 37 adjacent to the sidewalls of the plug 36. The etching is performed by a conventional process of anisotropic etching of the spacer layer produces the dielectric spacers 37. The preferred process of anisotropic etching employs a conventional reactive ion etching ambient gas selected from the group consisting of methane gas ($CF_4$) and oxygen gas ($O_2$), as will be well understood by those skilled in the art.

Figure 2E:
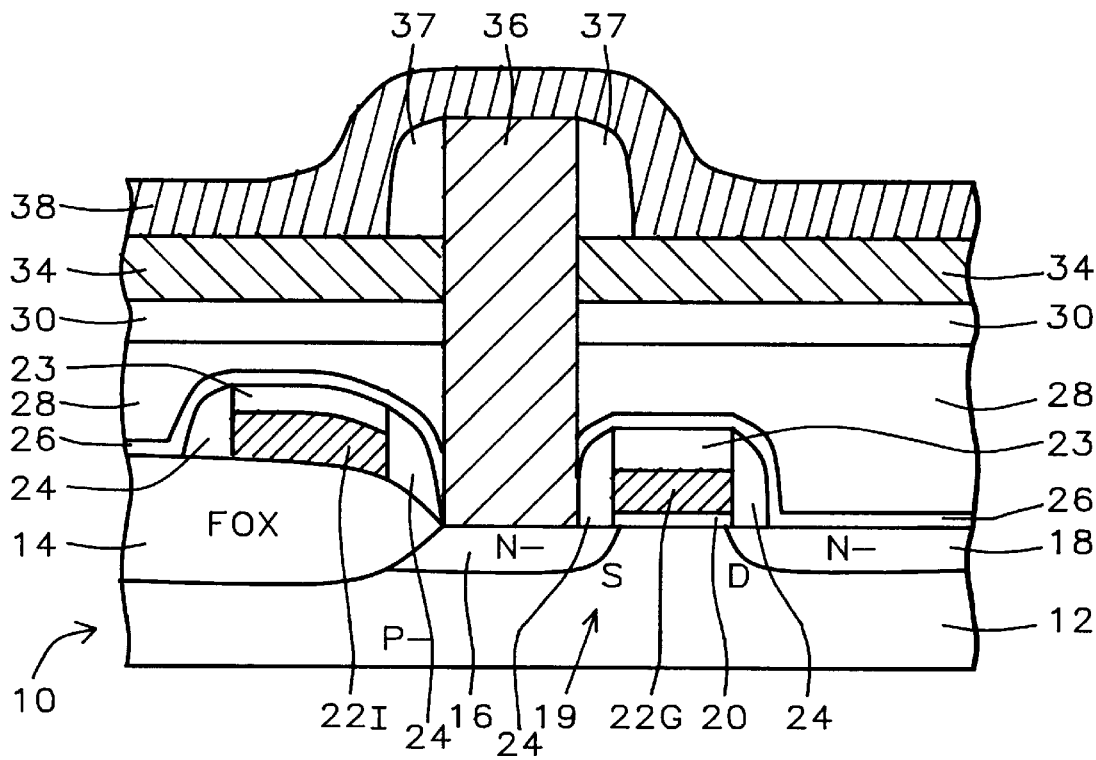

FIG. 2E shows the device of FIG. 2D after the blanket polysilicon layer 38 (P2-3) has been deposited over the device 10 in electrical and mechanical contact with the plug 36 (P2-2) and with the exposed surface of bottom polysilicon (P2-1) layer 34, aside from the spacers 37, which are temporarily buried under the layer 38.

Polysilicon layer 38 (P2-3) is preferably blanket deposited by LPCVD (Low Pressure Chemical Vapor Deposition) method. The preferred thickness of the first polysilicon layer is between about 500 Å and about 2,000 Å.

The blanket polysilicon layer 38 (P2-3) can be doped by several methods. One method includes ion implanting with phosphorous or arsenic ions with a dose of between 5 E 15 ions/cm$^2$ and 10 E 15 ions/cm$^2$ at an energy of between 20 keV and 60 keV. Alternatively the polysilicon layer is doped with phosphorus oxychloride at a temperature of about 900° C.

Figure 2F:
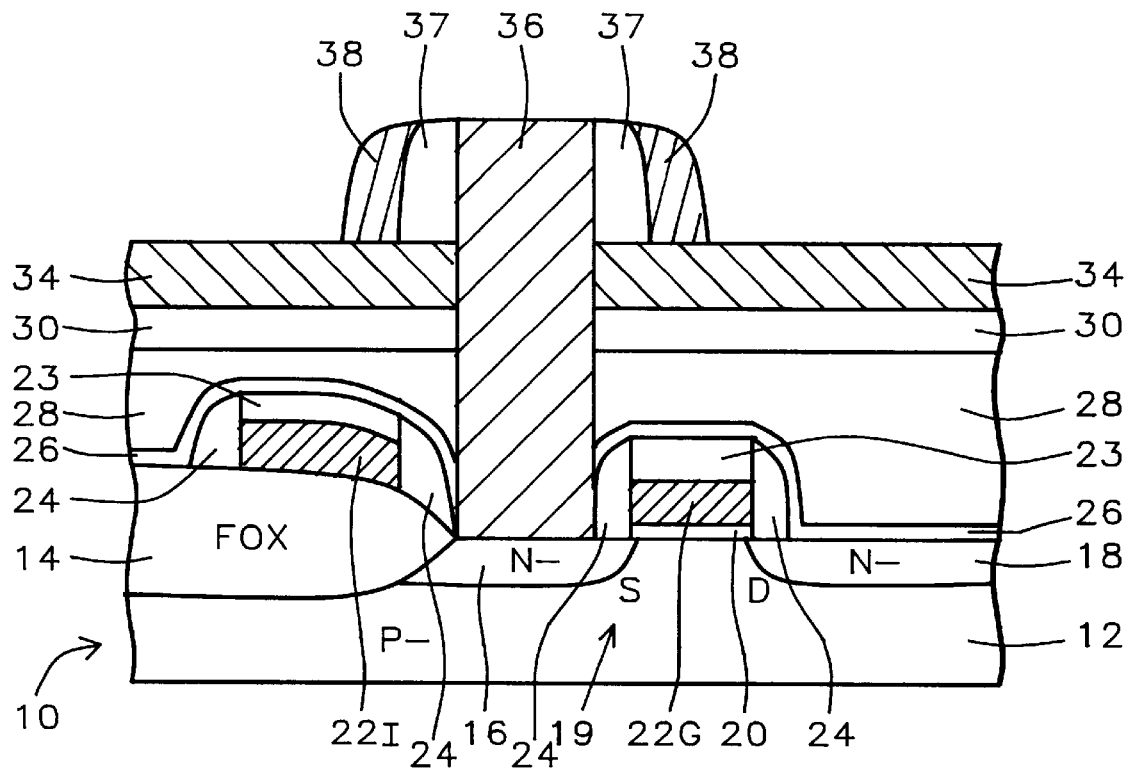

FIG. 2F shows the device of FIG. 2E after the blanket polysilicon layer 38 (P2-3) has been etched back with the silicon nitride layer 30 serving as an etch stop layer. The result is a pair of upright polysilicon elements 38 adjacent to the spacers 37 with a similar cross sectional shape to the spacers 37. The layer 38 has been etched by a process of plasma etching with a gas selected from the group consisting of chlorine gas (Cl$_2$) or methane gas (CF$_4$) at a pressure of between about 50 mTorr and about 400 mTorr.

Figure 2G:
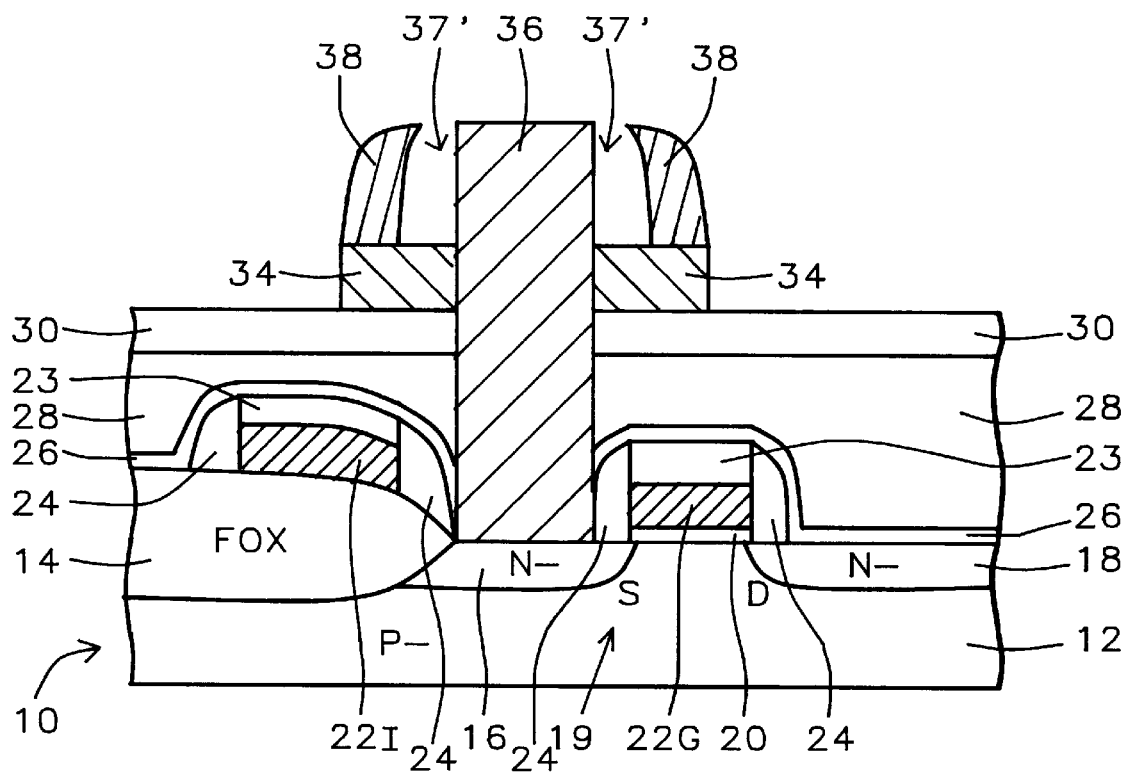

FIG. 2G shows the device of FIG. 2F after the TEOS glass spacers 37 have been etched away to form openings 37' between the upright polysilicon elements 38 and the polysilicon plug 36. The spacers 37 have been etched away in a wet etching process using buffered hydrogen fluoride (HF) as the etchant.

After etching is complete, the etchant is flushed or removed from the surface with deionized water cleaning.

If at this point the silicon nitride layer is wet etched away, the bottom plate of the crown can be enlarged to further increase the capacitor area.

The key feature here is that the central plug or bar 36 is superior when we shrink the cap size rather than employing another narrow ring as has been done in the prior art.

Figure 2H:
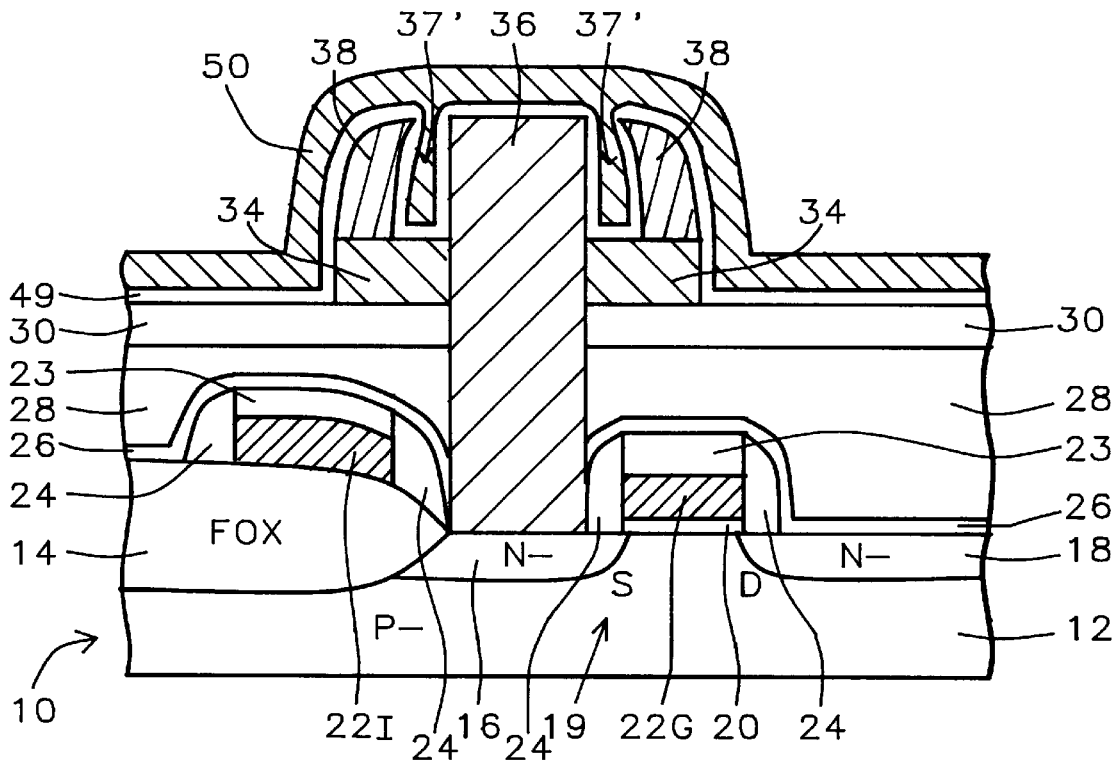

FIG. 2H shows the device of FIG. 2G after the formation of a conventional thin Nitride Oxide (NO) a conformal layer 49 of interconductor dielectric over exposed portion of silicon nitride layer 30, along the sidewalls of bottom polysilicon layer 34, and over the exposed surfaces of polysilicon plug 36 and upright polysilicon elements 38. Conformal layer 49 leaves spaces (openings) 37' between polysilicon plug 36 and upright polysilicon elements 38.

The NO layer 49 comprises two layers, i.e Silicon Nitride/Silicon Oxide including as follows:

N Nitride formed at 700°–800° C. by LPCVD

O Thermal oxide formed by thermal oxidation or CVD with a thickness of about 10–20 Å at about 900° C. for 10 minutes.

Then a blanket in-situ doped polysilicon layer 50 has been deposited on the top of the surface of NO layer 49 to serve as a top plate electrode of the capacitor. Layer 50 is between about 500 Å and about 1,500 Å thick.

Polysilicon layer 50 is the top plate of the DRAM capacitor of this invention.

The back-end process steps include planarization, after the top plate is formed, bit line, metal, passivation, etc. as will be well understood by those skilled in the art.

Alternative Process

Figure 4A:
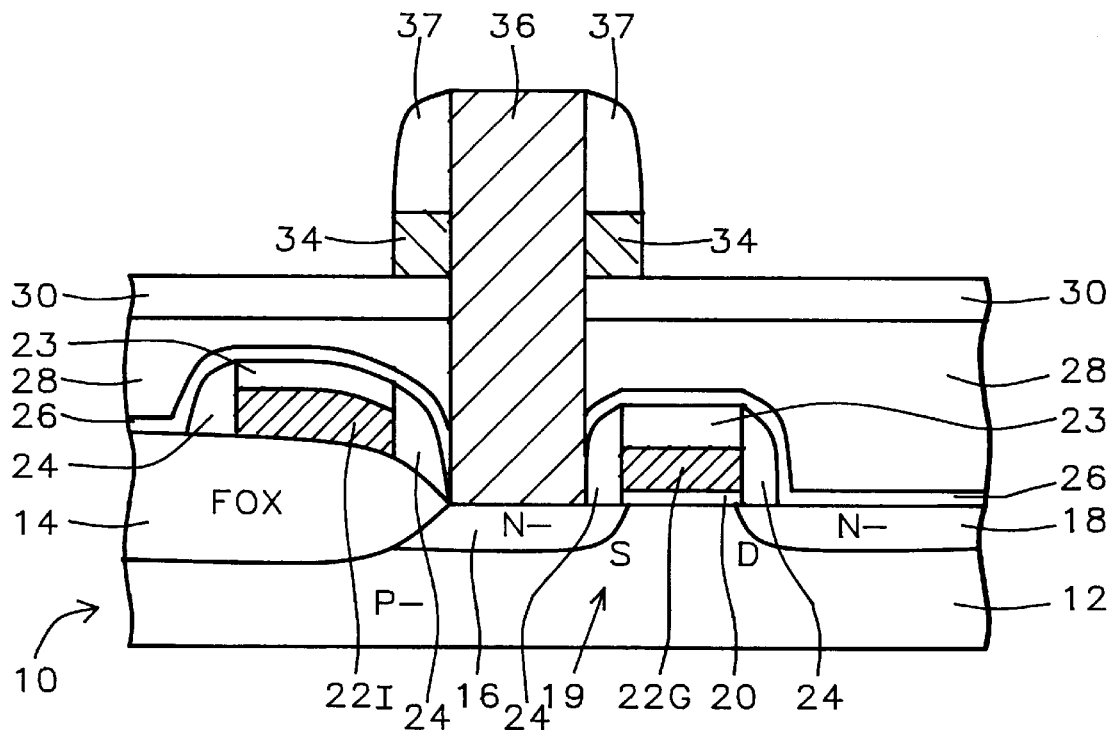
FIGS. 4A–4E shows a set of process steps which are an alternative to the process of FIGS. 2E–2H.
Figure 4B:
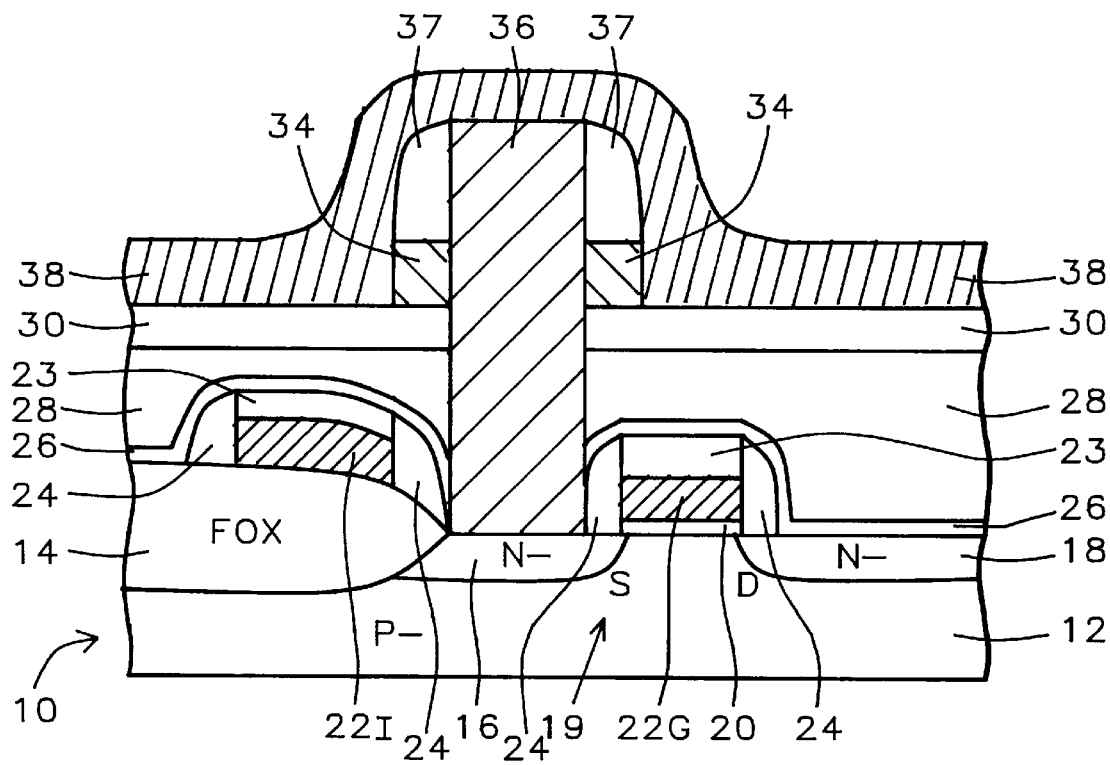
Figure 4C:
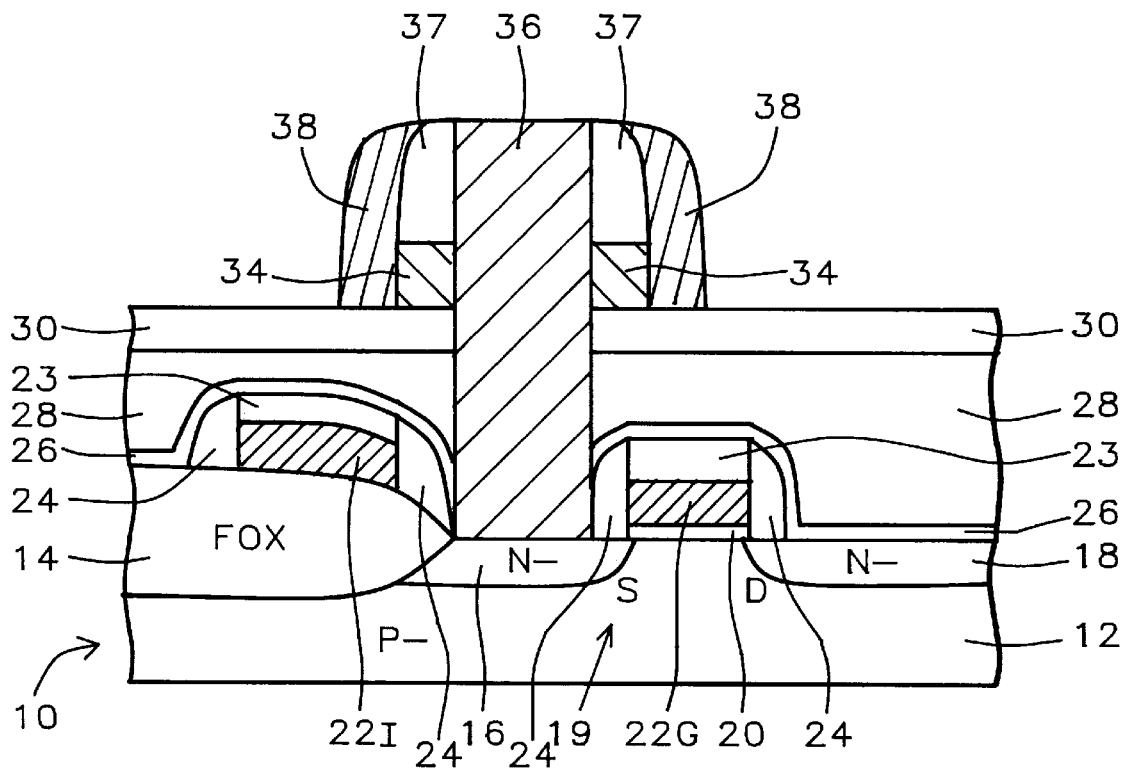
Figure 4D:
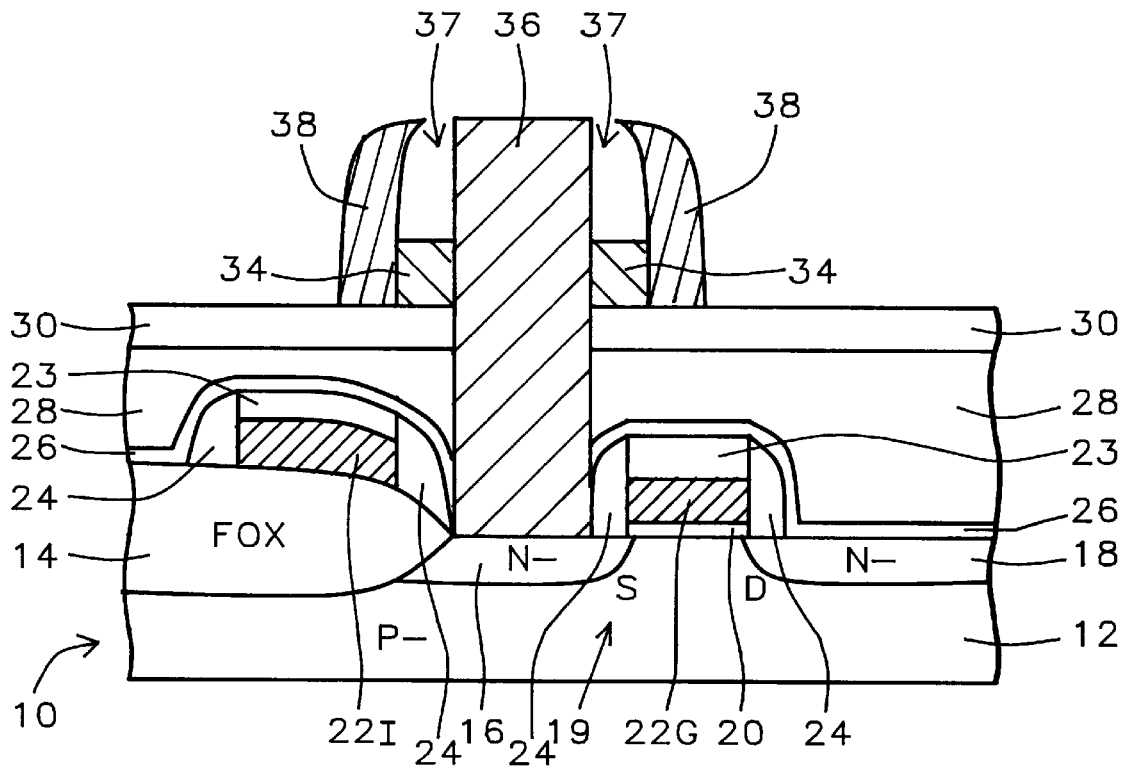
Figure 4E:
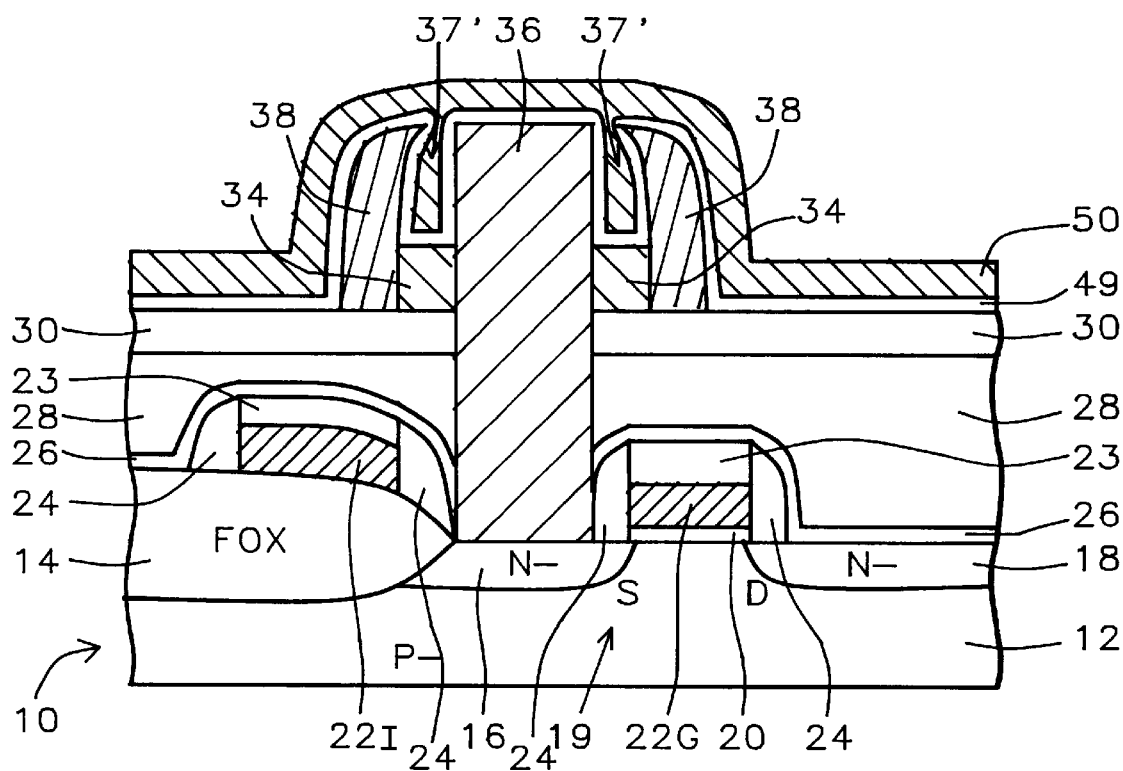

FIGS. 4A–4E shows a set of process steps which are an alternative to the process of FIGS. 2E–2H which are based upon the etching away of the exposed portion of the polysilicon layer 34 which are exposed after the step of forming the spacers 37, as shown in FIG. 4A.

FIG. 4B is analogous to FIG. 2E and the same process steps have been performed, with the exception that the layer 34 does not extend beyond the layer 37.

FIG. 4C is analogous to FIG. 2F and the same process steps have been performed.

FIG. 4D is analogous to FIG. 2G and the same process steps have been performed.

FIG. 4E is analogous to FIG. 2H and the same process steps have been performed.

FIG. 3 shows the result of an alternative process in which the silicon nitride layer 30 has been etched away after the process step of FIG. 2G, leaving an undercut under layer 34, i.e. layer 34 is temporarily cantilevered over the BPSG layer 28 after layer 30 has been etched away. Then the NO layer 49 is formed over the exposed surfaces of the device 10 before the formation of the top electrode plate 50, which because of the space left after layer 30 was etched away forms beneath layer 34. It is in this way that plate 50 underlies the lower surface of layer 34. This embodiment and the process which produced it has the advantage that the capacitance is increased further by the area at the bottom of the crown.

The bottom capacitor plate portions 1, 2 and 3 (layers 34, 36, 38 and FIG. 2H) of the bottom polysilicon (poly 2) plate can be doped in an in situ POC13 doping process.

Alternatively, an ion implantation process can be used to dope the bottom plate of the capacitor.

A material with a high dielectric value such as Ta$_2$O$_5$ can be used as the dielectric layer 49 for the capacitor in place of the ON layer described above.

The TEOS formed silicon dioxide layer 23 above the polysilicon gate 22G is deposited directly after the deposition of the polysilicon for the gate 22G.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A dynamic random access memory device having a coaxial capacitor formed thereon comprising:

field oxide areas (14) on the surface of a semiconductor substrate (12) with device areas for field effect devices (19) having gate structures and having source/drain structures (16, 18) formed in said substrate below said surface of said semiconductor substrate (12);

a gate dielectric layer (20) formed on said surface of said substrate (12) in said device areas;

a first layer (22) of polysilicon on the said field oxide areas (14) and said device areas patterned into said gate structures (22G) in said device areas, and an interconnector (22I) over one of said field oxide areas (14);

said source/drain structures formed within said device areas of said semiconductor substrate associated with said gate structures (22G);

a first oxide layer (26) formed over said device and field oxide areas; and a planarization silicon oxide layer (28) and a silicon nitride layer (30) over said device and field oxide areas (14), said silicon nitride layer (30) having a top surface, said capacitor formed with a lower plate having a first portion (34) with a contact opening therethrough extending towards one (16) of said source/drain structures having been etched through said device, said lower plate comprising a planar, horizontally oriented, first portion (34) of a capacitor plate doped polysilicon layer formed on said top surface of said silicon nitride layer (30), said lower plate including a vertically oriented monolithic second portion (36) of said lower capacitor plate comprising a plug composed of doped polysilicon, said plug (36) extending from above said first portion down through said contact opening through said first portion (34) into electrical and mechanical contact with said one (16) of said source/drain structures, said plug (36) having sidewalls and a top surface extending above and below the surface of said first portion (34), a third portion (38) of said lower plate comprises a doped polysilicon layer formed over said first portion (34) and adjacent to said plug (36) in electrical and mechanical contact with said first portion (34), and narrowly spaced away from said sidewalls of second portion (36) providing a narrow space (37') between said plug (36) and said third portion (38) extending from the top of said device, a conformal blanket interconductor dielectric layer (49) formed over the exposed surfaces of said lower plate including said first portion (34), said plug (36), and said third portion (38) providing an exposed surface of said interconductor dielectric layer leaving a narrow space between said plug (36) and said third portion (38), and an upper capacitor plate (50) over said interconductor dielectric layer (49) including a sliver thereof extending into said narrow space (37') between said plug (36) and said third portion (38) and said upper capacitor plate being coaxial with said lower plate.

2. The device of claim 1 wherein:

said silicon nitride layer (30) comprises an etch stop layer which is sandwiched between said planarization layer (28) and said first portion (34).

3. The device of claim 2 wherein:

said silicon nitride layer (30) comprises an etch stop layer which is sandwiched between said planarization layer (28) and said first portion (34), and said etch stop layer (30) has a thickness of about 500 Å.

4. The device of claim 1 wherein:

said interconductor dielectric layer (49) and said upper plate (50) reach between said second portion (36) and said third portion (38) extending down towards said bottom layer (34) and said planarization layer (28).

5. A dynamic random access memory device having a coaxial capacitor formed thereon comprising:

field oxide areas on the surface of a semiconductor substrate with device areas for field effect devices having gate structures and having source/drain structures formed in said substrate below said surface of said semiconductor substrate;

a gate dielectric layer formed on said surface of said substrate in said device areas;

a first layer of polysilicon on the said field oxide areas and said device areas patterned into said gate structure in said device areas;

said source/drain structures formed within said device areas of said semiconductor substrate associated with said gate structures;

a first oxide layer formed over said device and field oxide areas; and a planarized dielectric material (28) over said device and field oxide areas, a silicon nitride layer (30) over said planarized dielectric material, said silicon nitride layer having a top surface, said capacitor formed with a contact opening to one of said source/drain structures etched through said planarized dielectric material (23, 30), a bottom layer (34) of said capacitor being composed of doped polysilicon formed on said top surface of said silicon nitride layer 30, said bottom layer (34) comprising a planar, horizontally oriented doped polysilicon layer and said bottom layer being a first portion of a lower capacitor plate, a vertically oriented monolithic plug (36) comprising a second portion of said lower capacitor plate composed of doped polysilicon extending from above said bottom layer (34) down through said bottom layer (34) and said horizontally oriented dielectric into contact with said one of said source/drain structures, said plug (36) having sidewalls and a top surface extending above and below the surface of said bottom layer (34), an upright structure (38) comprising a third portion of said lower capacitor plate composed of doped polysilicon formed over said bottom layer (34) and adjacent to said plug (36) in electrical and mechanical contact with said bottom layer (34), and narrowly spaced away from said sidewalls of plug (36) providing a narrow space between said plug (36) and said third portion (36) from the top of said device, a conformal blanket interconductor dielectric layer (49) formed over the exposed surfaces of said lower plate providing an exposed surface of said interconductor dielectric layer leaving a narrow space between said plug (36) and said upright structure (38), and an upper capacitor plate (50) over said interconductor dielectric layer (49) including a sliver thereof extending into said narrow space between said plug (36) and said upright structure (38), said upper plate being coaxial with said lower plate.

6. The device of claim 5 wherein:

said planarized dielectric material (28) over said device and field oxide areas comprises a silicon oxide layer (28), and said silicon nitride layer comprising an etch stop layer which is sandwiched between said silicon oxide layer (28) and said bottom layer (34).

7. The device of claim 5 wherein:

said planarized dielectric material (28) over said device and field oxide areas comprises a silicon oxide layer (28), said silicon nitride layer comprising an etch stop layer which is sandwiched between said silicon oxide layer (28) and said bottom layer (34), and said etch stop layer (30) has a thickness of about 500 Å.

8. The device of claim 5 wherein:

said interconductor dielectric layer (49) and said upper plate (50) reach between said plug (36) and said upright structure (38), extending down towards said bottom layer (34).

9. A dynamic random access memory device having a coaxial capacitor formed thereon comprising:

field oxide areas on the surface of a semiconductor substrate with device areas for field effect devices having gate structures and having source/drain structures formed in said substrate below said surface of said semiconductor substrate;

a gate dielectric layer formed on said surface of said substrate in said device areas;

a first layer of polysilicon on the said field oxide areas and said device areas patterned into said gate structure in said device areas;

said source/drain structures formed within said device areas of said semiconductor substrate associated with said gate structures;

a first oxide layer formed over said device and field oxide areas;

a planarized dielectric material (28) over said device and field oxide areas, a silicon nitride layer (30) over said planarized dielectric material, said silicon nitride layer having a top surface, said capacitor formed with a lower plate having a contact opening to one of said source/drain structures having been etched through said silicon nitride layer and said planarized dielectric material (28), a bottom layer (34) of said lower plate composed of doped polysilicon formed on said top surface of said silicon nitride layer, said bottom layer (34) comprising a planar, horizontally oriented doped polysilicon layer, and said bottom layer being a first portion of said lower capacitor plate, a vertically oriented monolithic plug (36) comprising a second portion of said lower capacitor plate composed of doped polysilicon extending down from above said bottom layer (34) through said horizontally oriented dielectric into contact with said one of said source/drain structures, said plug (36) having sidewalls and a top surface extending above and below the surface of said bottom layer (34), an upright structure (38) comprising a third portion of said lower capacitor plate composed of doped polysilicon formed over said bottom layer (34) and adjacent to said plug (36) in electrical and mechanical contact with said bottom layer (34), and narrowly spaced away from said sidewalls of plug (36) by a narrow space comprising the space having been defined by a sacrificial spacer structure between said plug (36) and said third portion (36) from the top of said device wherein said sacrificial spacer structure having been etched away from the sidewalls of said plug (36), a conformal blanket interconductor dielectric layer (49) formed over the exposed surfaces of said lower plate providing an exposed surface of said interconductor dielectric layer leaving a narrow space between said plug (36) and said upright structure (38), and an upper capacitor plate (50) over said interconductor dielectric layer (49) including a sliver thereof extending into said narrow space between said plug (36) and said upright structure (38) and said upper capacitor plate being coaxial with said lower plate.

10. The device of claim 9 wherein:

said planarized dielectric material (28, 30) over said device and field oxide areas comprises a silicon oxide layer (28), said silicon nitride layer comprising an etch stop layer which is sandwiched between said silicon oxide layer (28) and said bottom layer (34).

11. The device of claim 9 wherein:

said planarized dielectric material (28, 30) over said device and field oxide areas comprises a silicon oxide layer (28), said silicon nitride layer comprising an etch stop layer which is sandwiched between said silicon oxide layer (28) and said bottom layer (34), and said etch stop layer (30) has a thickness of about 500 Å.

12. The device of claim 9 wherein:

said interconductor dielectric layer (49) and said upper plate (50) reach into said space between said plug (36) and said upright structure (38), extending down towards said bottom layer (34).

13. The device of claim 1 wherein:

the thickness of said first portion of said lower capacitor plate layer is between about 500 Å and about 1,000 Å, the thickness of said second portion of said lower capacitor plate layer is between about 1,000 Å and about 3,000 Å, and the thickness of said third portion of said lower capacitor plate layer is between about 500 Å and about 2,000 Å.

14. The device of claim 13 wherein:

said upper capacitor plate has a thickness between about 500 Å and about 1,500 Å.

15. The device of claim 13 wherein:

said interconductor dielectric layer comprises silicon nitride and silicon oxide layers, and said upper capacitor plate has a thickness between about 500 Å and about 1,500 Å.

16. The device of claim 5 wherein:

the thickness of said first portion of said lower capacitor plate layer is between about 500 Å and about 1,000 Å, the thickness of said second portion of said lower capacitor plate layer is between about 1,000 Å and about 3,000 Å, and the thickness of said third portion of said lower capacitor plate layer is between about 500 Å and about 2,000 Å.

17. The device of claim 16 wherein:

said upper capacitor plate has a thickness between about 500 Å and about 1,500 Å.

18. The device of claim 16 wherein:

said interconductor dielectric layer comprises silicon nitride and silicon oxide, and said upper capacitor plate has a thickness between about 500 Å and about 1,500 Å.

19. The device of claim 9 wherein:

the thickness of said first portion of said lower capacitor plate layer is between about 500 Å and about 1,000 Å, the thickness of said second portion of said lower capacitor plate layer is between about 1,000 Å and about 3,000 Å, and the thickness of said third portion of said lower capacitor plate layer is between about 500 Å and about 2,000 Å.

20. The device of claim 19 wherein:

said interconductor dielectric layer comprises silicon nitride and silicon oxide, and said upper capacitor plate has a thickness between about 500 Å and about 1,500 Å.

* * * * *